United States Patent
Hayashi et al.

(10) Patent No.: US 7,459,187 B2
(45) Date of Patent: Dec. 2, 2008

(54) SURFACE-TREATMENT METHOD AND EQUIPMENT

(75) Inventors: Kazushi Hayashi, Kobe (JP); Toshihiro Kugimiya, Kobe (JP); Takashi Kobori, Kobe (JP); Junichi Ebisawa, Yokohama (JP); Kazuo Sato, Yokohama (JP); Yukio Yoshikawa, Yokohama (JP)

(73) Assignees: Kabushiki Kaisha Kobe Seiko Sho, Hyogo (JP); Asahi Glass Co., Ltd., Tokyo (JP)

( * ) Notice: Subject to any disclaimer, the term of this patent is extended or adjusted under 35 U.S.C. 154(b) by 300 days.

(21) Appl. No.: 10/577,235

(22) PCT Filed: Oct. 27, 2004

(86) PCT No.: PCT/JP2004/016288

§ 371 (c)(1),
(2), (4) Date: Apr. 26, 2006

(87) PCT Pub. No.: WO2005/040454

PCT Pub. Date: May 6, 2005

(65) Prior Publication Data

US 2007/0134414 A1   Jun. 14, 2007

(30) Foreign Application Priority Data

Oct. 29, 2003   (JP) .............................. 2003-369212

(51) Int. Cl.
*H05H 1/24* (2006.01)
(52) U.S. Cl. ........................ 427/569; 427/583; 427/584; 118/720; 118/723 R; 118/730
(58) Field of Classification Search ................ 427/251, 427/569, 583, 584; 118/720, 723 R, 730, 118/627
See application file for complete search history.

(56) References Cited

U.S. PATENT DOCUMENTS 5,679,410 A * 10/1997 Sugita et al. ................ 427/523

(Continued)

FOREIGN PATENT DOCUMENTS

| JP | 7-94424 | 9/1993 |
|---|---|---|
| JP | 8-17747 | 6/1994 |
| JP | 9-104985 | 7/1996 |
| JP | 11-172446 | 12/1997 |
| JP | 2001-120988 | 10/1999 |
| JP | 2002-180256 | 12/2000 |
| JP | 2002-237480 | 7/2001 |
| JP | 2004-39799 | 7/2002 |
| WO | WO 2005/040454 A1 | 5/2005 |

OTHER PUBLICATIONS

International Search Report of PCT/JP2004/016288 mailed Feb. 22, 2005.

*Primary Examiner*—Binh X Tran
(74) *Attorney, Agent, or Firm*—Reed Smith LLP; Stanley P. Fisher, Esq.; Juan Carlos A. Marquez, Esq.

(57) ABSTRACT

An object of the present invention is to make it possible to uniformly supply of a gas onto a base material in a way simpler and lower in cost, and thus, to realize a high-quality surface treatment. For that purpose, in surface treatment of a base material (12) by supplying a surface-treating gas on the surface of the base material (12) while conveying it in a particular direction, the peripheral surface of a rotor having a cylindrical peripheral surface (24) is made to face, via a gap (23), the surface of the base material (12) or an opposing member (20) formed at a position separated from the base material and the rotor is rotated around the axis in the direction almost perpendicular to the base material (12)-conveying direction, as the means for supplying the surface-treating gas. By the rotation, the surface-treating gas is dragged in by the peripheral surface of the rotor (24), guided into the gap (23), and then, fed from the gap (23) onto the surface of the base material (12).

27 Claims, 12 Drawing Sheets

U.S. PATENT DOCUMENTS

| | | | |
|---|---|---|---|
| 6,269,663 B1 * | 8/2001 | Drouart et al. | 65/391 |
| 7,105,205 B2 * | 9/2006 | Clayton et al. | 427/446 |
| 7,294,283 B2 * | 11/2007 | Madocks | 216/67 |
| 2003/0051664 A1 * | 3/2003 | Stanbery | 118/715 |
| 2003/0113479 A1 * | 6/2003 | Fukuda et al. | 427/569 |
| 2003/0138573 A1 * | 7/2003 | Mikhael et al. | 427/569 |

* cited by examiner

SURFACE-TREATMENT METHOD AND EQUIPMENT

FIELD OF THE INVENTION

The present invention relates to a method and an equipment for surface-treating the surface of a base material such as glass plates, for example for formation of various oxide layers by using a chemical reaction for example by plasma.

BACKGROUND OF THE INVENTION

A method of surface treatments using an electrode facing a base material for plasma generation almost cylindrical in shape and rotating it at a high speed rotation was developed recently as a means of forming a film or the like by using chemical reaction (Japanese Unexamined Patent Publication No. 9-104985, p. 7 to 8, FIGS. 1 and 2).

The equipment described in the application is an equipment in which the surface-treating gas is dragged into the space between a rotary electrode and a base material by rotation of the rotary electrode where plasma is generated, while a base material is conveyed, the rotary electrode is rotated, and a radio/high frequency power (or DC power) is applied to the rotary electrode; and it is possible to form a thin film on the surface of the base material by conveying the base material therein while the plasma is generated.

The equipment is useful as a means of performing surface treatment under atmospheric pressure or a pressure close to it, but it is very difficult to control the clearance of the narrow gap between the base material and the rotary electrode, and thus, slight vibration of the base material on conveyor belt or bend of the base material by heat may impair favorable treatment.

The remote plasma CVD described in Japanese unexamined patent publication No. 2002-237480, p. 7 to 8, FIG. 3) would be a possible means of eliminating such strict dimensional control. According to the method, a film is deposited on the surface of a base material by forming a solid dielectric substance on at least one opposing face of opponent electrodes facing each other, generating discharge plasma while supplying a surface-treating gas in under a pressure close to atmospheric pressure and applying a pulsed electric field between the electrodes, and inducing the plasma into contact with the surface of the base material placed outside the discharge space.

SUMMARY OF THE INVENTION

To make the film-thickness distribution on the base material surface uniform in the remote plasma CVD above, it is necessary to distribute the surface-treating gas uniformly in the direction perpendicular to the base material-conveying direction. In particular in formation of a film, in which flow of the source gases exerts an influence directly on the thickness distribution of the film formed, uniformization of the gas supplied in the direction perpendicular to the base material-conveying direction is a very important object.

In conventional processes under reduced pressure (vacuum), it was relatively easy to mix a gas sufficiently and form a uniform film even by placing gas exhaust nozzles at a suitable distance because the mean free path of molecules is longer; but, under a pressure close to atmospheric pressure, the gas flow falls in the range of viscous flow, making it difficult to ensure uniform distribution of gas.

To overcome the problems, the Japanese unexamined patent publication No. 2002-237480, FIG. 6, discloses a method of uniformizing gas flow in the direction perpendicular to the base material-conveying direction to suppress the pressure drop by placing an inclined plate at the gas inlet; but, because the actual flow falls in the range of viscous flow, the gas flow is easily influenced by operational conditions such as the primary pressure at the gas inlet, the reaction pressure in the surface-treatment area, and the kind of the gas used; and accordingly, it is difficult to form a uniform gas flow consistently independent of the conditions. That is, it is very difficult to design an equipment compatible with various operational conditions, and the difficulty becomes more distinct when the distance between the base material and the active-material source such as plasma is longer.

In view of the circumstances above, an object of the present invention is to make it possible to uniformly supply a gas onto a base material in a way simpler and lower in cost and thus to realize a high-quality surface treatment; and provided as the means for that purpose is a surface-treatment method, comprising an operation of conveying a base material in a particular direction and a gas-supplying operation of supplying a surface-treating gas onto the surface of the base material, wherein the gas-supplying operation is performed by using a surface-treatment equipment having an opposing member formed at a position separated from the base material and a rotor with a cylindrical peripheral surface facing the opposing member, the opposing member and the peripheral surface being separated by a narrow gap from each other, and by rotating the rotor around the axis almost perpendicular to the base material-conveying direction and allowing the surface-treating gas to be dragged by the peripheral surface of the rotor into the narrow gap and further fed from the gap onto the base material surface.

The method allows uniform supply of the surface-treating gas onto the base material surface in the direction perpendicular to its conveying direction and as a result, makes favorable surface treatment possible, by rotating the rotor around the axis almost perpendicular to the base material-conveying direction in the state where it faces, via a narrow gap, the base material surface or the opposing member separated from the base material surface, and by using a way of allowing the surface-treating gas to be dragged in by rotation of the rotor and blowing out the gas dragged in from the gap.

Different from those by generating plasma in the gap between a base material and a rotary electrode, the method does not demand strict dimensional control and allows uniform supply of the surface-treating gas from the gap.

The gas-supplying operation may be to supply the gas passing out of the gap directly onto the base material surface, but, in such a case, the gas passing out of the gap may become lower in pressure because of gas expansion; but it is possible to supply the gas in a more stabilized pressure state, by feeding the gas flowing back from the gap toward upstream in the rotor-rotation direction onto the surface of the base material.

The "surface-treating gas" according to the present invention includes a wide range of gases supplied onto the base material surface for surface treatment, and examples thereof include gases accelerating the chemical reaction for surface treatment, gases for generating plasma, gases for maintaining the flow in the treatment equipment, and the like.

The "back flow toward upstream in the rotor-rotation direction" is gas flow in the direction having at least a vector component toward upstream in the rotor-rotation direction, and is intended to include gas flow in the direction somewhat inclined from the vector.

For activation of the surface-treating gas, for example, an electric field for plasma generation is formed in the region from the rotor to the surface of the base material, and a surface-treating gas is supplied to the position where the electric field is formed.

When the surface treatment includes thin-film formation on the surface of the base material, a thin film is formed on the surface of the base material, by adding a source gas being source material for the thin film to the surface-treating gas and subjecting the source gas to a chemical reaction on the base material surface or in the neighborhood thereof, or alternatively, by supplying the plasma generated by supplying the surface-treating gas into the electric field or radical species excited by the plasma onto the surface of the base material, supplying the sources gas being raw material for thin film into the plasma or radical species and subjecting the source gas to the chemical reaction on the base material surface or in the neighborhood thereof.

In the latter case, it is possible to obtain an advantage of elongating the maintenance period of the rotor and improving the efficiency, by avoiding formation of an undesirable thin film on the rotor surface. In such a case, the surface-treating gas preferably contains at least one of an inert gas and an oxygen-containing gas; examples of the inert gases include nitrogen, helium, argon, krypton, xenon, and the like; and examples of the oxygen-containing gases include oxygen gas, air, steam, nitrous oxide and the like.

The present invention also include an equipment for performing the method above, i.e., a surface-treatment equipment, comprising a base material-conveying means of conveying a base material in a particular direction and a gas-supplying means of supplying a surface-treating gas onto the surface of the base material, wherein: the gas-supplying means further comprises a rotor having a cylindrical peripheral surface with an axis almost perpendicular to the base material-conveying direction, a rotating means of rotating the rotor around the axis and an opposing member placed at a position facing the peripheral surface of the rotor as separated by a gap; and the opposing member is so placed that the surface-treating gas dragged in by the peripheral surface with the rotation of the rotor is driven to the gap between the peripheral surface of the rotor and the opposing member and fed from the gap onto the base material surface.

In the equipment, it is more preferable that the gas-supplying means has the rotor and the opposing member placed so that the gas flowing back from the gap toward upstream in the rotor-rotation direction is fed onto the surface of the base material.

In addition, in the equipment having an electric field-forming means of forming an electric field for plasma generation in the region from the rotor to the surface of the base material wherein a surface-treatment plasma is generated by flow of the surface-treating gas in the electric field, it is possible to efficiently supply and activate the surface-treating gas simultaneously and concurrently.

The shape of the opposing member is not particularly limited, but, if the opposing member has a configuration having a guide plane for guiding the surface-treating gas from the gap to the surface of the base material, it is possible to guide the surface-treating gas driven into the gap onto the base material surface in a more stabilized state.

In such a case, the guide plane may be placed at the position facing the rotor peripheral surface, or one side wall of the opposing member may be used as the guide plane, by making the opposing member planer in shape and allowing the end face thereof to face the peripheral surface of the rotor. In the latter case, it is possible to reduce the size of the opposing member, because the entire side wall of the opposing member can be used effectively as the guide plane.

When the end face of the opposing member faces the rotor peripheral surface, it is possible to control the gap more easily, by making the surface of the end face compatible with the peripheral surface of the rotor shape.

In a configuration having, in addition to the opposing member, a downstream opposing member facing the peripheral surface of the rotor as separated by a distance at a position downstream of the opposing member in the rotor-rotation direction, and at least one gas-supplying unit for supplying a gas other than the surface-treating gas into the region between the downstream opposing member and the opposing member, wherein the downstream opposing member is so placed that the gas supplied from the gas-supplying unit is dragged in by the peripheral surface of the rotor and guided from the gap between the rotor and the downstream opposing member along the downstream opposing member to the base material surface, it is possible to supply both the surface-treating gas and the gas different therefrom onto the base material surface by using a common rotor. Thus, it is possible to perform base-material surface treatment by supplying two lines of gases in a simpler configuration.

Specifically, in a configuration having an electric field-forming means of forming an electric field for plasma generation in the region from the gap between the rotor and the opposing member to the base material surface, wherein a surface-treatment plasma is generated by the flow of the surface-treating gas in the electric field and a source gas for forming a thin film on the base material surface through the chemical reaction by the surface-treatment plasma is supplied from the gas-supplying unit, it is possible to supply both the surface-treating gas in the plasma state and the source gas concurrently onto the material surface by rotation of the rotor, and thus, to form a thin film on the base material surface efficiently.

Then, the distance between the rotor and the opposing member is more preferably smaller than the distance between the rotor and the downstream opposing member. Thus, it is possible to raise the sealing efficiency at the gap between the rotor and the opposing member and more effectively prevent a mixing of the surface-treating gas and the gas supplied from the gas-supplying unit.

In the equipment according to the present invention, a rectification member is more preferably placed at a position facing the guide plane so that the surface-treating gas flows between the rectification member and the guide plane. In the configuration, it is possible to guide the gas from the gap onto the base material surface more efficiently.

It is also possible to supply the gas at high efficiency and activate the gas by guiding it into the plasma region more reliably, by placing plasma-generating electrodes on the guide plane and the face of the opposing rectification member and subjecting the surface-treating gas to the chemical reaction by allowing the surface-treating gas to pass between the electrodes in the state where an voltage is applied between these electrodes.

The clearance between the guide plane of the opposing member and the rectification member is preferably greater than the clearance between the peripheral surface of the rotor and the guide plane. In this manner, it is possible to ensure the blowout of the surface-treating gas from the gap and guide the blowout gas smoothly onto the base material surface at the same time.

Alternatively, in a configuration further comprising a partitioning member covering the rotor and the opposing member, wherein the partitioning member has a surface-treating-gas inlet port for introducing a surface-treating gas into the partitioning member and a surface-treating-gas outlet port for exhausting the surface-treating gas from the gap between the rotor and the opposing member in the partitioning member to the surface of the base material, it is possible to guide a required surface-treating gas onto the base material surface more efficiently and intensively by supplying a surface-treating gas into the restricted space in the partitioning member and allowing it to be dragged in by the rotor.

In the surface-treatment equipment according to the present invention, also favorable is a configuration wherein the opposing member is placed between the surface of the base material and the rotor as it also faces the surface of the base material and a gas outlet port located at the opposing member is placed upstream of the position where the clearance between the opposing member and the rotor is minimal in the rotor-rotation direction so that the gas flowing back from the gap toward upstream in the rotor-rotation direction is fed through the gas outlet port onto the base material surface.

In the configuration, the gas flowing back from the gap formed between the peripheral surface of the rotor and the opposing member is supplied through the gas outlet port formed in the opposing member onto a stabilized position of the base material.

Further, if the gas outlet port is a gap extending in the direction in parallel with the rotor-rotation-axis direction, it is possible to supply the gas uniformly in its direction, i.e., the direction perpendicular to the base material-conveying direction.

Alternatively, in a configuration wherein the opposing member has a concave curving along the peripheral surface of the rotor and is placed at a position where an almost uniform narrow gap is formed between the concave and the peripheral surface of the rotor in the circumferential direction, it is also possible to increase the amount of the gas flowing back from the gap to be supplied from the gas outlet port onto the surface of the base material, and thus, to further improve the treatment efficiency by raising the gas-flow resistance of the gap effectively.

Alternatively, in a configuration further comprising a partitioning member covering the rotor, wherein the partitioning member has a surface-treating-gas inlet port for introducing a surface-treating gas into the partitioning member and part of the wall constituting the partitioning member represents the opposing member present between the rotor and the base material, it is possible to guide the required surface-treating gas onto the base material surface more efficiently and intensively and to simplify the equipment by using part of the partitioning member wall also as the opposing member, by supplying the surface-treating gas into the restricted space in the partitioning member and allowing it to be dragged in by the rotor.

The present invention also include surface-treatment equipment of treating the surface of a base material by subjecting a surface-treating gas to a chemical reaction on the base material surface or in the neighborhood thereof, comprising a base material-conveying means of conveying a base material in a particular direction and a gas-supplying means of supplying a surface-treating gas onto the surface of the base material for treating the surface of the base material, wherein: the gas-supplying means comprises a rotor having a cylindrical peripheral surface with an axis almost perpendicular to the base material-conveying direction, the peripheral surface facing the surface of the base material conveyed by the base material-conveying means, a rotating means of rotating the rotor around the axis, a partitioning member covering the rotor except the region of the rotor facing the surface of the base material and an electric field-forming means of forming an electric field between the face of the partitioning member facing the surface of the base material and the surface of the base material; the surface-treating gas supplied into the partitioning member is driven into the gap between the peripheral surface of the rotor and the surface of the base material by rotation of the rotor as it is dragged in by the peripheral surface; and the rotor and the partitioning member are so placed that plasma is generated as the surface-treating gas is supplied from the gap into the region where an electric field is formed by the electric field-forming means.

In the equipment, the gas dragged in by the rotor is guided into the gap between the rotor and the base material and supplied from the gap onto the surface of the base material surface. In such a case too, different from conventional methods of forming plasma between the rotary electrode and the base material, a gas is supplied from the gap between the rotor and the base material onto another region of the base material surface, and thus, there is no need for strict dimensional control of the gap a clearance between the rotor and the base material; and it is possible to supply the surface-treating gas onto the base material surface uniformly in the direction perpendicular to its conveying direction.

In the equipment too, it is more preferable that the gas-supplying means has a rotor and a partitioning member so placed that the gas flowing back from the gap between the rotor and the base material surface toward upstream in the rotor-rotation direction is fed into the electric field-forming region.

The clearance between the base material surface and its opposing face of the partitioning member in the electric field-forming region is more preferably greater than the clearance between the base material surface and the peripheral surface of the rotor.

BEST MODE OF CARRYING OUT THE INVENTION

Favorable modes for carrying out the present invention will be described below with reference to drawings. Although the present invention is favorably used in preparation of oxide films such as of titania, silica, zircon, and tin oxide, it may also be applied to all materials that can be formed by common CVD. The kinds of the carrier gas and the oxidizer used during formation of the film may be determined properly according to the kind of the source gas, a raw material for the thin film. In addition to film formation, the present invention is also applicable to other plasma treatments such as etching.

Among the embodiments shown below, if the gas is so supplied that the gas flowing back from the gap between the rotor and the opposing member toward upstream in the rotor rotation direction is fed onto the base material surface, the clearance of the gap between the rotor and the opposing member is preferably smaller to the extent that the back-flow of the gas described below does occur. The specific clearance may be decided arbitrarily, but is generally 5 mm or less, more preferably 2 mm or less. By deciding the gap clearance in a suitable range, it is possible to generate a gas-blocking effect and make part or all of the gas fed into the gap flow back toward upstream in the rotor rotation direction by the increase in pressure in the gap region. The gas flowing back from the gap between the rotor and the opposing member toward upstream in the rotor rotation direction may be fed as it is onto the base material surface, or fed onto the base material surface after adjustment of its flow direction, for example, in a gas outlet port.

Figure 1:
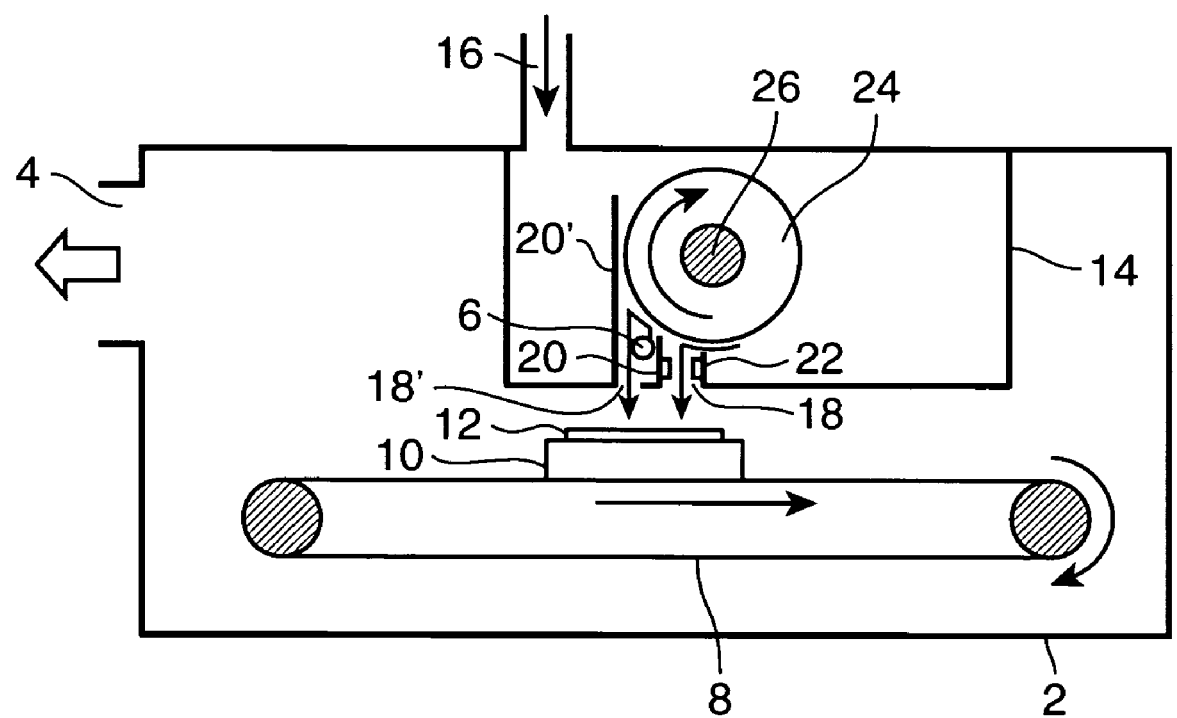
FIG. 1 is a cross-sectional front view illustrating an example of surface-treatment equipment supplying a surface-treating gas by using a rotor, an opposing plate and a downstream opposing plate in combination.
Figure 2A:
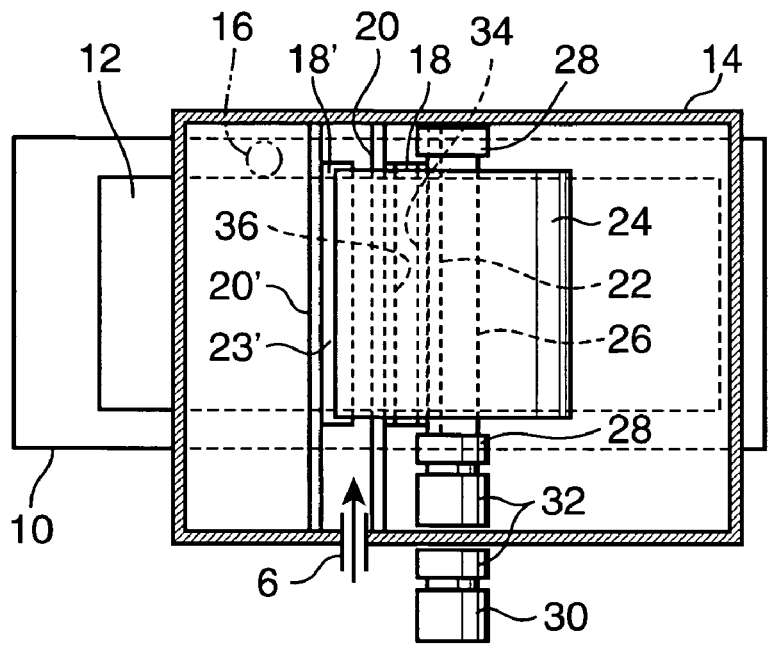
FIG. 2A is a cross-sectional top view illustrating the main region of the equipment shown in FIG. 1; 2B, a cross-sectional front view illustrating the main region; and 2C, a sectional view illustrating the gap formed between the rotor peripheral surface and the opposing plate in the same equipment.
Figure 2B:
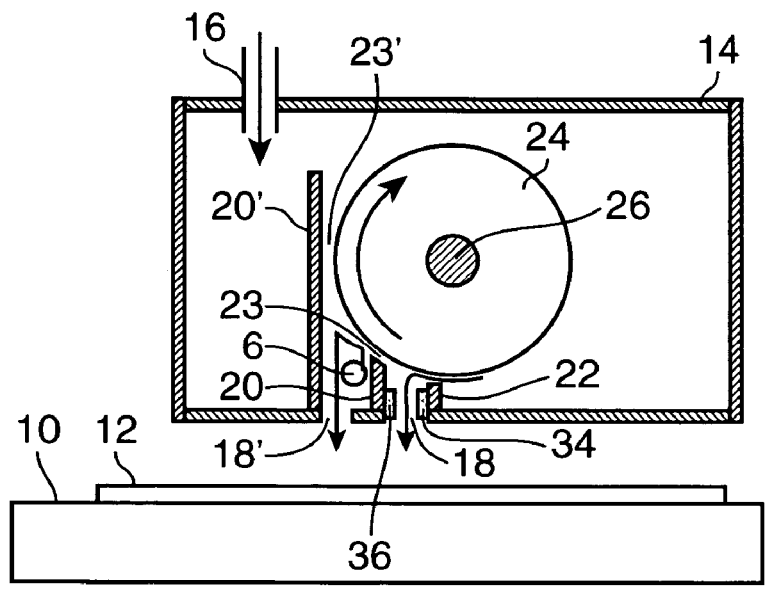
Figure 2C:
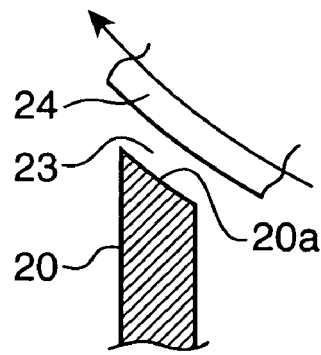

FIGS. 1 and 2 show an example of the surface-treatment equipment utilizing a combination of a rotor 24, an opposing plate (opposing member) 20, and a downstream opposing plate (downstream opposing member) 20'. As shown in FIG. 1, the equipment has a chamber 2, which has an exhaust vent 4 on the side wall of the chamber 2. There is a base-material conveying belt 8 installed in the bottom of the chamber 2 as it extends in a particular direction (horizontal direction in FIG. 1), and the base material 12 is conveyed on the base-material conveying belt 8 in the longitudinal direction (direction from left to right in the Figure) as the base material 12 is mounted on the base-material conveying plate 10 fixed on the base-material conveying belt 8 and held in the horizontal attitude. There is a partitioning member 14 occupying part of the space in the chamber 2 installed above the base-material conveying belt 8.

The base material 12 is not particularly limited, if it can be surface-treated, and examples thereof include glass and plastic films. When glass is used as the base material, the thickness of the glass is preferably 0.3 to 15 mm from the point of strength.

As shown in FIG. 2, at least one surface-treating-gas inlet port 16 is formed at the top of the partitioning member 14, and a surface-treating-gas outlet pory 18 and a source gas outlet port 18' are formed at the bottom along the base material-conveying direction. An opposing plate 20, a downstream opposing plate 20', a rectifier plate (rectification member) 22, and a rotor 24 are placed inside the partitioning member 14.

The rotor 24, which is shaped cylindrical with a cylindrical peripheral surface, is installed therein with its axis in the horizontal direction and almost perpendicular to the direction conveying the base material (depth direction in FIG. 2B). Specifically, a rotating shaft 26 penetrating the rotor 24 is fixed along the axis of the rotor 24, and the both edges of the rotating shaft 26 are supported rotatably by a pair of bearing stands 28 installed on the bottom wall of the partitioning member 14.

There is a rotating means, motor 30, installed outside the partitioning member 14. Magnet couplings 32 cooperatively rotating by magnetic force are connected respectively to the output shaft of the motor 30 and part of the rotating shaft 26, and these magnet couplings 32 are placed inside and outside the partitioning member 14 holding it in between. Thus, by operation of the motor 30, the rotor 24 is driven to rotate around the axis of the rotating shaft 26, i.e., in the direction almost perpendicular to the base material-conveying direction. The surface-treating-gas outlet port 18 is placed at a position upstream in the rotation direction of rotor 24 to the source gas outlet port 18' (right side in FIGS. 2A and 2B).

The opposing plate 20, downstream opposing plate 20', and rectifier plate 22 are all flat plate in shape, and rise almost vertically from the bottom wall in the attitude in parallel with each other. Specifically, the opposing plate 20 rises upward at an edge position downstream of the surface-treating-gas outlet port 18 in the rotor rotation direction (left edge area in FIGS. 2A and 2B), and the top face 20a thereof faces the peripheral surface of the rotor 24 with a gap 23 in between. The top face 20a has a curved surface compatible with the peripheral surface of the rotor 24, and the clearance of the gap between the top face 20a and the peripheral surface of the rotor 24 is uniformized.

The downstream opposing plate 20' rises upward at an edge area downstream of the source gas outlet port 18' in the rotor rotation direction (left-sided edge in FIGS. 2A and 2B), and one side wall thereof (right-sided wall in FIGS. 2A and 2B) faces the peripheral surface of the rotor 24 sideways with a gap 23' in between. In addition, at least one gas inlet 6 for supplying the source gas described below sideways into the region is formed in the region between the downstream opposing plate 20' and the opposing plate 20.

The clearance of the gap 23 between the top face 20a of the opposing plate 20 and the peripheral surface of the rotor 24 is preferably set to be smaller than the clearance between the side wall of the opposing plate 20 and the side wall of the rectifier plate 22, and additionally, than the clearance of the gap 23' between the downstream opposing plate 20' and the peripheral surface of the rotor 24. The specific clearance of the gap may be decided arbitrarily, but it is generally possible to obtain a gas-blocking efficiency to some extent in the gap 23 by setting the clearance of the gap 23' to approximately 0.5 to 1.0 mm and that of the gap 23 to approximately 0.1 mm.

The rectifier plate 22 rises upward at the edge area upstream of the surface-treating-gas outlet port 18 in the rotor rotation direction (right-sided edge in FIGS. 2A and 2B), and forms with the opposing plate 20 a surface-treating-gas guiding passage rising almost vertically. Thus, the side wall of the opposing plate 20 facing the rectifier plate 22 functions as a guide plane. In addition, a gap sufficiently separated for allowing smooth flow of the surface-treating gas (sufficiently thicker than the gaps 23 and 23') is formed between the top face of the rectifier plate 22 and the rotor 24.

A discharge electrode 34 and a ground electrode 36 for applying an electric field for plasma generation are formed at positions between the rotor 24 and the base material 12 (at positions in the surface-treating-gas guiding passage) in the equipment. The ground electrode 36 is fixed onto the side wall of the opposing plate 20 close to the surface-treating-gas outlet port 18, while the discharge electrode 34 onto the side wall of the rectifier plate 22 at a position facing the ground electrode 36. An electric field for plasma generation is generated between the electrodes 34 and 36, as the ground electrode 36 is earthed and a radio/high frequency voltage (or DC voltage) is applied to the discharge electrode 34.

Hereinafter, a method of forming an oxide film on the surface of the base material 12 in the equipment will be described.

Following operations proceed simultaneously in the method.

1) Base material-conveying operation: A base material 12 is placed on a base-material conveying plate 10, which is preheated by a heater not shown in the Figure, and conveyed along the longitudinal direction of the conveyor belt 8 to the position below the surface-treating-gas outlet port 18 and the source gas outlet port 18' of the partitioning member 14.

2) Source gas supplying operation: A source gas (for example, tetraethoxysilane (TEOS) for forming a silicon oxide film) and a carrier gas such as argon are supplied through the gas inlet 6 into the region between the opposing plate 20 and downstream opposing plate 20'.

3) Surface-treating-gas supplying operation: A surface-treating gas is supplied through the surface-treating-gas inlet port 16 into the partitioning member 14. In this embodiment, the surface-treating gas contains at leas one of a carrier gas of inert gas such as argon and an oxidizer, i.e., an oxygen-containing gas such as $O_2$, $N_2O$, $NO_2$, air, or steam. In the partitioning member 14, the rotor 24 rotates at high speed by operation of the motor 30 in the arrow direction shown in FIGS. 1, 2A and 2B, i.e., in the direction of the peripheral speed component of the peripheral surface of the rotor 24 at the gap 23 between the peripheral surface of the rotor 24 and the top face 20a of the opposing plate 20 leaving from the surface of the base material 12 on the base-material conveying plate 10.

The surface-treating gas, which is dragged in by the peripheral surface by rotation of the rotor 24, is driven to the gap 23; most of the surface-treating gas flows back toward upstream in the rotation direction of the rotor 24 because the clearance of the gap 23 is small, and is discharged from the surface-treating-gas outlet port 18 to the surface of the base material 12 along the side wall of the opposing plate 20 (guide plane), i.e., the guide passage between the opposing plate 20 and the rectifier plate 22.

When an electric field at a particular strength is applied between the discharge electrode 34 and the ground electrode 36 then, plasma is generated with the surface-treating gas flowing between both electrodes 34 and 36, and the plasma or at least radical species generated by activation of the surface-treating gas by the plasma are supplied onto the surface of the base material 12.

In the region downstream of the opposing plate 20 in the rotation direction of the rotor 24, the source gas supplied through the gas inlet 6 is dragged in by the peripheral surface of the rotor 24 similarly and driven to the gap 23' between the peripheral surface of the rotor 24 and the downstream opposing plate 20', and the source gas flowing back from the gap 23' is supplied through the source gas outlet port 18' onto the surface of the base material 12 along the side wall of the downstream opposing plate 20'. The source gas is then mixed with the plasma or the radical species above, forming a thin film on the surface of the base material 12 in chemical reaction. The gas not consumed in the reaction is discharged from the gas outlet port 4 to outside of the chamber 2.

The method does not demand strict control of the gap clearance, compared to traditional methods, for example, of generating plasma in the narrow gap between a rotary electrode and a base material 12; and, in addition, it is possible to perform high-quality surface treatment by supplying a surface-treating gas onto the base material 12 uniformly in the width direction (direction perpendicular to the base material-conveying direction) while using the drag-in of the surface-treating gas by rotation of the rotor 24 and back-flow of the surface-treating gas from the gap 23 between the rotor 24 and the opposing plate 20.

In particular in the equipment shown in the Figure, it is possible to supply the surface-treating gas and the source gas simultaneously and concurrently onto the surface of the base material 12 by using a common rotor 24 and thus form a favorable thin film in a smaller and simpler configuration.

Figure 3:
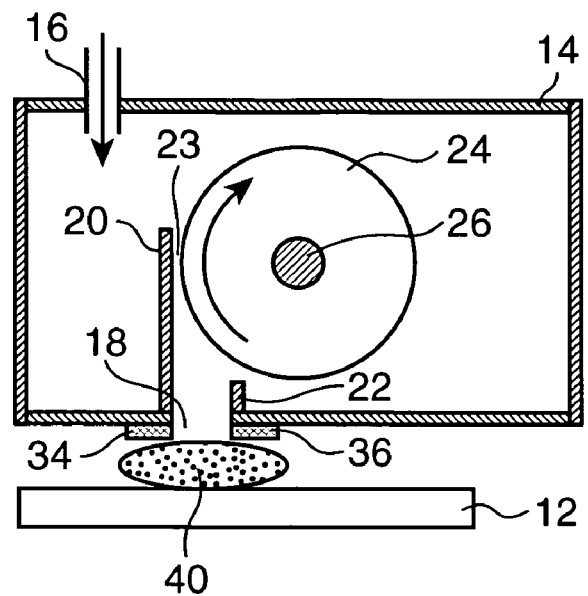
FIG. 3 is a cross-sectional front view illustrating the main region of surface-treatment equipment supplying a surface-treating gas by using a rotor and an opposing plate installed almost in the vertical state in combination.

The present invention is not particularly limited to the method of supplying two lines of gases simultaneously by using a common rotor 24, and a line of gas may be supplied while only one single opposing plate 20 is installed, as shown in FIG. 3. For formation of a thin film in the equipment, for example, a gas inlet 6 is formed in the chamber 2, and a source gas is supplied into the chamber 2.

Figure 4:
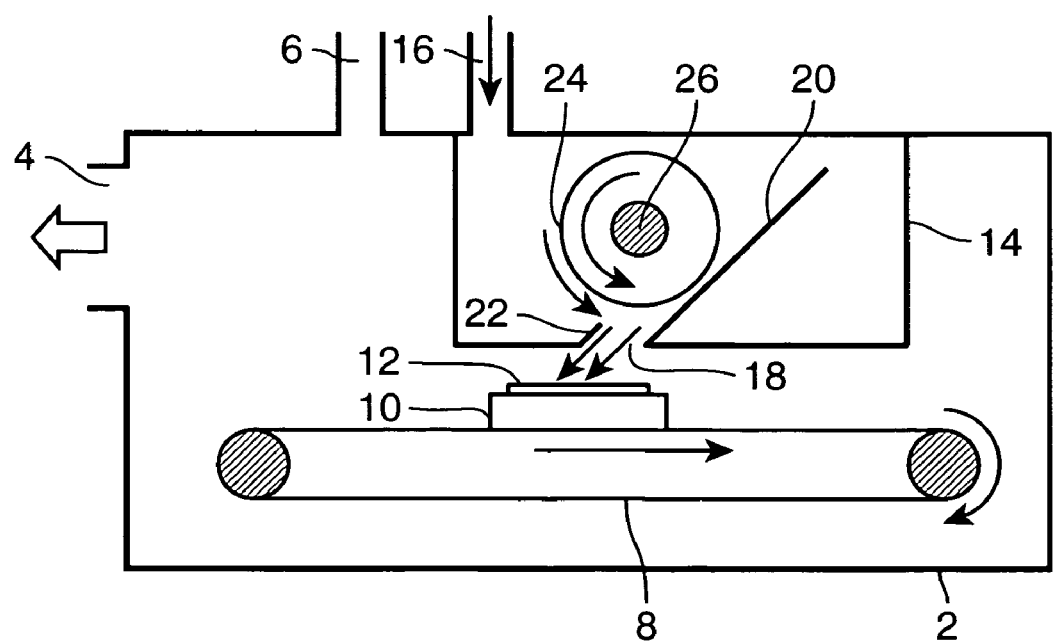
FIG. 4 is a cross-sectional front view illustrating an example of surface-treatment equipment supplying a surface-treating gas by using a rotor and an opposing plate installed in an inclined state in combination.
Figure 5A:
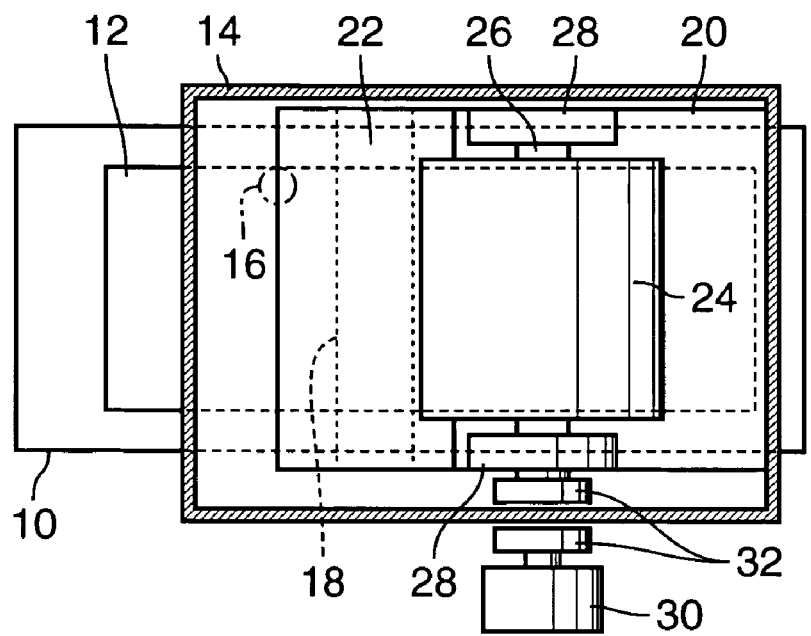
FIG. 5A is a cross-sectional top view illustrating the main region of the equipment shown in FIGS. 4; and 5B, a cross-sectional front view illustrating the same main region.
Figure 5B:
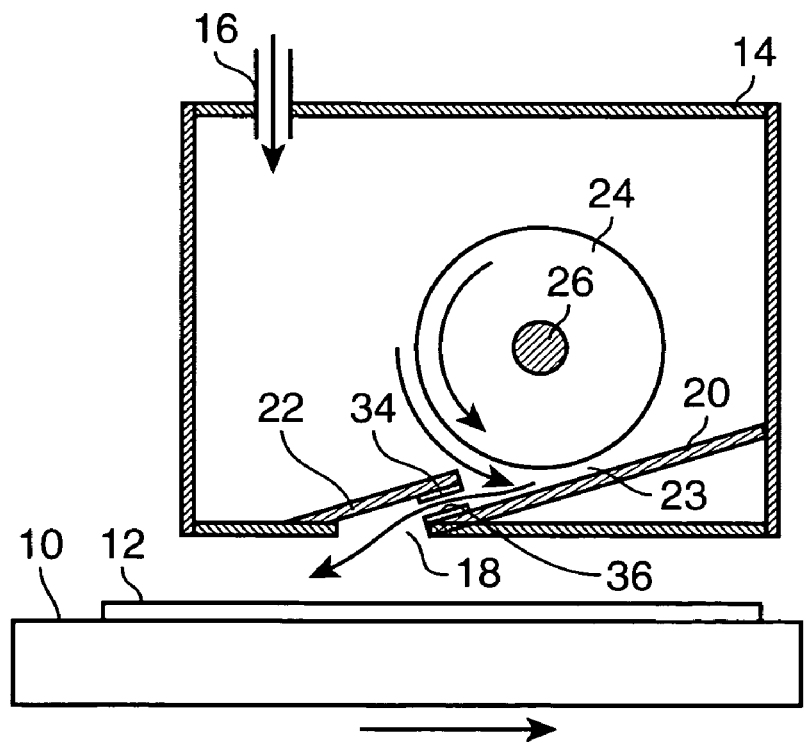

Specific configuration of the opposing member is not limited in the present invention. FIGS. 4 and 5 show an opposing plate 20 in the inclined configuration. In the example shown in the Figure, the opposing plate 20 is placed on the bottom of partitioning member 14 in the attitude where the top face (guide plane) thereof descends gradually toward the surface-treating-gas outlet port 18. The rectifier plate 22 is also inclined almost in parallel with the opposing plate 20, and placed in a position facing the terminal of the opposing plate 20 from above in the area close to the surface-treating-gas outlet port 18, forming a surface-treating-gas guiding passage with the opposing plate 20. In such a case too, when a source gas is supplied through a gas inlet 6 shown in FIG. 4, the gas forms a thin film on the surface of the base material 12 in chemical reaction with the plasma or radical species supplied from the surface-treating-gas guiding passage. The clearance of the gap 23 between the peripheral surface of the rotor 24 and the surface of the opposing plate 20 is preferably smaller, and it is preferable to make the clearance of the surface-treating-gas outlet port 18 and the clearance of the gap between the bottom wall of the partitioning member 14 and the surface of the base material 12 greater than the clearance.

It is also possible to form a thin film by supplying the source gas together with the surface-treating gas fed into the partitioning member 14 into the plasma and inducing the activated gas onto the surface of the base material 12. In such a case, for example, only a carrier gas is supplied through the gas inlet 6 into the chamber 2. However, a thin film is formed to some extent on the surface of rotor 24 in such a case; but, if the surface-treating gas fed into the partitioning member 14 is supplied onto the surface of the base material 12 separately with the source gas as in the previously described method, it is possible to obtain the advantages of improved efficiency and extension of the maintenance period of rotor 24 by avoiding formation of a thin film on the surface of rotor 24.

Figure 6:
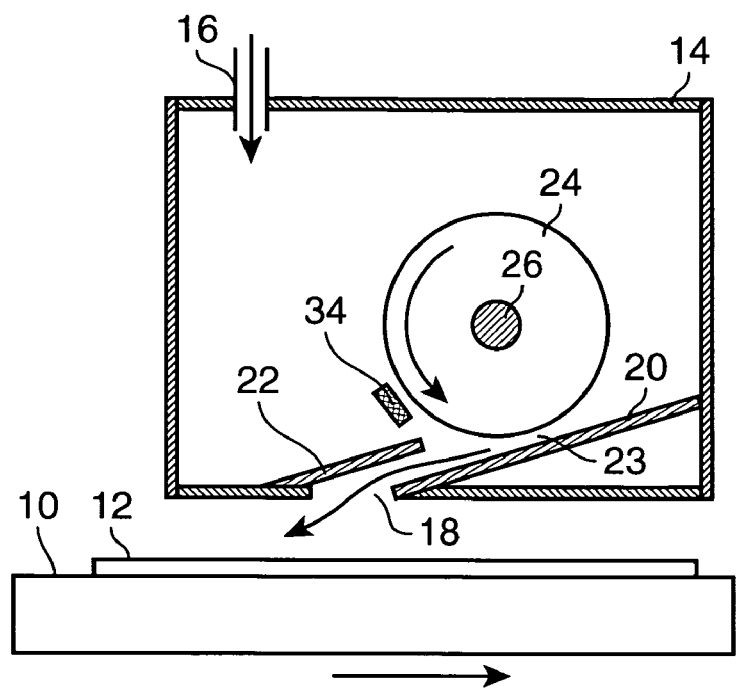
FIG. 6 is a cross-sectional front view illustrating an example of a discharge electrode placed at a position facing the rotor peripheral surface in the surface-treatment equipment above.
Figure 7:
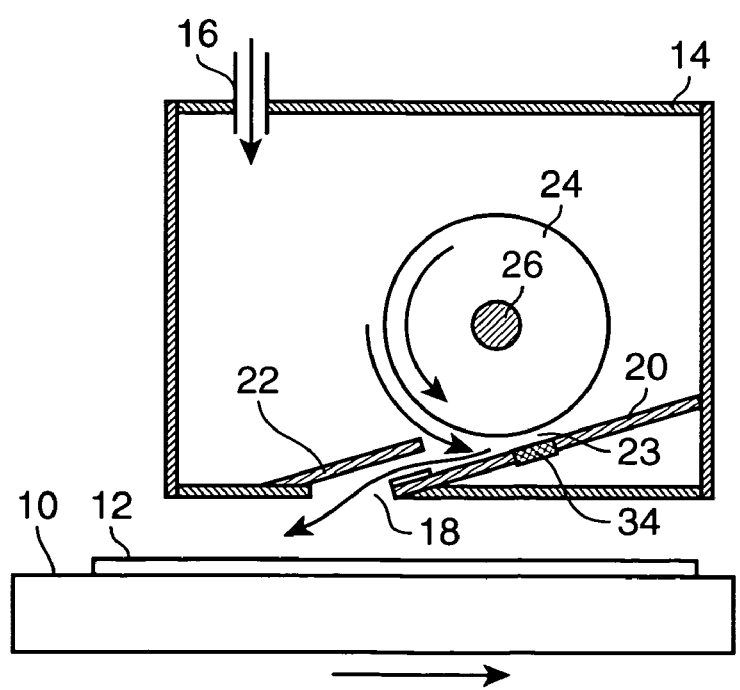
FIG. 7 is a cross-sectional front view illustrating an example of a discharge electrode placed at a position facing the rotor peripheral surface in the surface-treatment equipment above.

The place of the electric field formed is arbitrary in generating plasma in the partitioning member 14; and, for example, the plasma may be generated at the place of an electric field formed by applying an electric field between the discharge electrode 34 and the rotor 24 while the discharge electrode 34 is installed at a position immediately above the rectifier plate 22 as shown in FIG. 6 or connected to the opposing plate 20 as shown in FIG. 7 and then the rotor 24 is grounded. In such a case too, the surface of the base material is processed as the plasma is supplied together with the surface-treating gas through the surface-treating-gas outlet port 18 onto the surface of the base material 12.

Specifically, in the equipment shown in FIG. 6, the surface-treating gas excited by the discharge between the discharge electrode 34 and the rotor 24 is dragged into the gap 23 between the rotor 24 and the opposing plate 20 or in the neighborhood thereof and supplied onto the surface of the base material 12 by back flow, while in the equipment shown in FIG. 7, the surface-treating gas dragged into the gap 23 or in the neighborhood thereof is excited by the plasma formed in the gap 23 and supplied onto the surface of the base material 12 by back flow.

A rotor 24 and an opposing plate 20 are placed in a partitioning member 14 in the equipment shown in FIGS. 1 to 7, but part of the wall of the partitioning member 14 may be used as the opposing member and in this way, the configuration of the equipment can be simplified.

Figure 8:
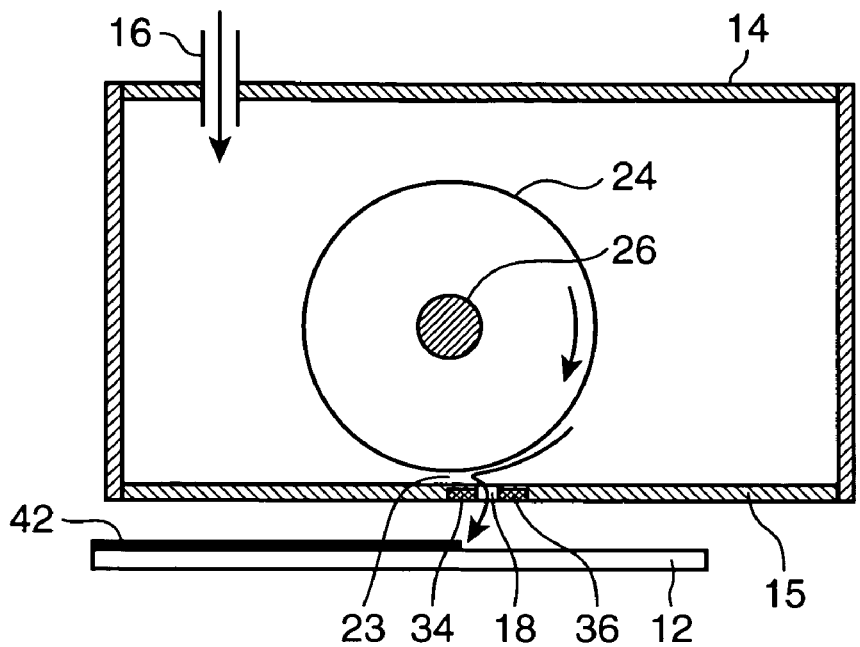
FIG. 8 is a cross-sectional front view illustrating surface-treatment equipment in which the peripheral surface of the rotor faces the internal wall of partitioning-member bottom wall, a gap-shaped surface-treating-gas outlet port is formed closed to it, and discharge and ground electrodes are formed on both sides of the surface-treating-gas outlet port.

FIG. 8 shows a configuration wherein the bottom wall 15 of the partitioning member 14 functions as the opposing member. In the Figure, the partitioning member 14 enclose the entire rotor 24, and the bottom wall 15 of the partitioning member 14 is present between the peripheral surface of the rotor 24 and the surface of the base material 12. The rotor 24 is placed at a position where the peripheral surface thereof faces the internal wall (top face) of the bottom wall 15 of the partitioning member 14 separated by a very thin gap 23.

A surface-treating-gas outlet port 18 located vertically at the bottom wall 15 of the partitioning member 14 is formed in the bottom wall 15. The surface-treating-gas outlet port 18 is gap-shaped and extends in the direction in parallel with the rotating shaft 26 of rotor 24, and is placed upstream of the position where the gap between the peripheral surface of the rotor 24 and the bottom wall 15 of partitioning member 14 is minimal in the rotation direction of the rotor 24 (right side in the Figure). In addition, a plasma-generating means, a discharge electrode 34 and a ground electrode 36 are connected to the underside of the bottom wall 15 of the partitioning member 14 holding the surface-treating-gas outlet port 18 in between.

In the equipment, the surface-treating gas fed into the partitioning member 14 is dragged in by the peripheral surface of the rotor 24 by its rotation and directed to the gap 23, and then, most of the gas flows back toward upstream in the rotation direction of the rotor 24; but because there is a gap-shaped surface-treating-gas outlet port 18 in the upstream side, the gas flowing back from the gap 23 is supplied, in the stable curtain-shaped state extending in the direction parallel to the rotating shaft 26 of the rotor 24 (i.e., direction perpendicular to the base material-conveying direction), from the surface-treating-gas outlet port 18 onto the surface of the base material 12. The gas supplied generates plasma during flow in the electric field at a particular strength applied between the discharge electrode 34 and the ground electrode 36, the plasma, or, at least the radical species generated by activation of the surface-treating gas by the plasma are supplied onto the surface of the base material 12, forming a thin film 42.

Similarly to the equipment shown in FIG. 6, in the plasma-generating means, the rotor 24 may be grounded and a discharge electrode 34 be placed at a position facing it on the peripheral surface. In the equipment shown in FIG. 9, a discharge electrode 34 is fixed on the bottom wall 15 of partitioning member 14 at a position further upstream of the surface-treating-gas outlet port 18 in the rotation direction of the rotor 24, and an inclined face 34a facing the peripheral surface of the rotor 24 is formed on the discharge electrode 34. In the equipment, the surface-treating gas dragged in by the peripheral surface of the rotating rotor 24 flows through the plasma 40 formed between the discharge electrode 34 and the rotor 24, and flows back before the gap 23, and is fed through the surface-treating-gas outlet port 18 onto the surface of the base material 12.

Figure 9:
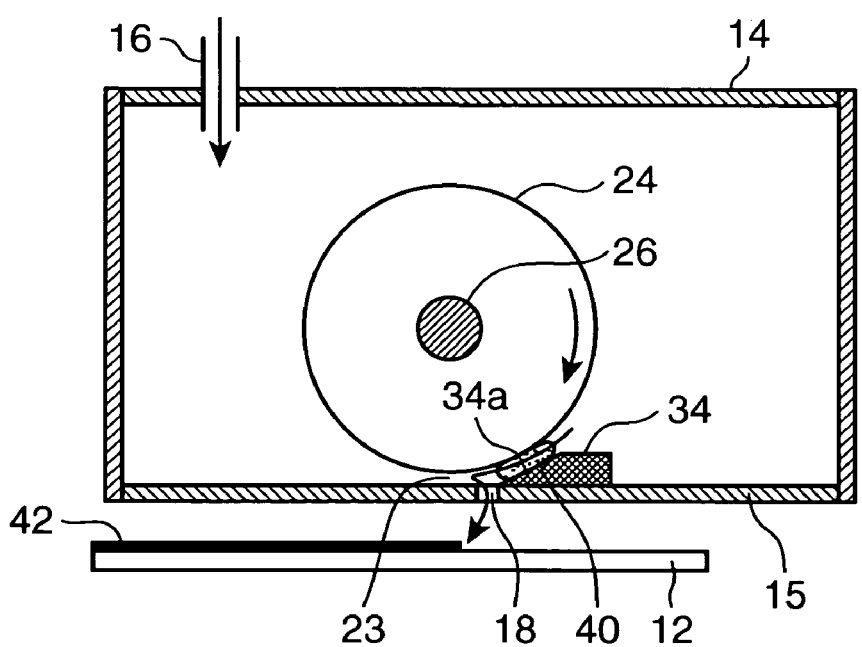
FIG. 9 is a cross-sectional front view illustrating surface-treatment equipment in which the peripheral surface of the rotor faces the internal wall of partitioning-member bottom wall, a gap-shaped surface-treating-gas outlet port is formed closed to it, and a discharge electrode faces the peripheral surface of a grounded rotor.

In the equipment shown in FIG. 8 or 9, it is possible to control the flow rate and the region of the gas supplied from the bottom wall 15 properly according to the set shape of the surface-treating-gas outlet port 18, and thus, to perform stabilized surface treatment. Favorable examples of the dimensions and positions of the gap 23 and the surface-treating-gas outlet port 18 will be shown in Examples 4 and 5 below.

Figure 10:
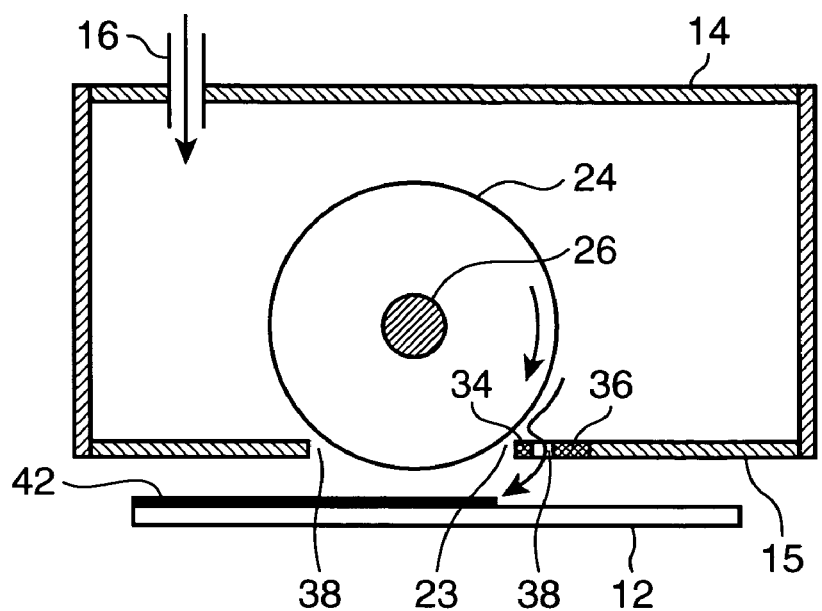
FIG. 10 is a cross-sectional front view illustrating surface-treatment equipment in which the peripheral surface of the rotor faces the internal wall of partitioning-member bottom wall, a gap-shaped surface-treating-gas outlet port is formed closed to it, and discharge and ground electrodes are formed on both sides of the surface-treating-gas outlet port.
Figure 11:
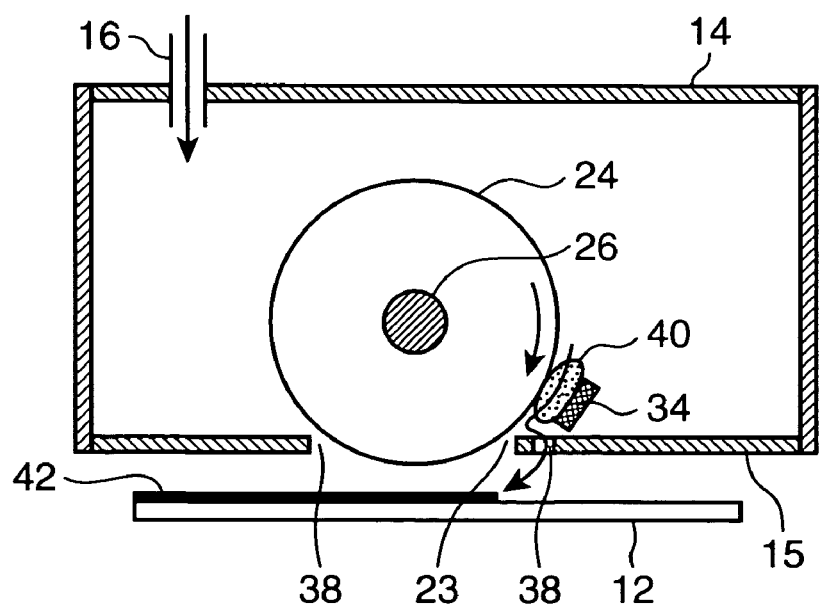
FIG. 11 is a cross-sectional front view illustrating surface-treatment equipment in which the peripheral surface of the rotor faces the internal wall of partitioning-member bottom wall, a gap-shaped surface-treating-gas outlet port is formed closed to it, and a discharge electrode faces the peripheral surface of a grounded rotor.

As described above, even if the bottom wall 15 of partitioning member 14 is used as the opposing member, the entire rotor 24 is not necessarily enclosed in the partitioning member 14, and, as shown in FIGS. 10 and 11, part of the rotor 24 may stick out of the partitioning member 14 through an opening 38 formed on the bottom wall 15 (toward base material 12 in the Figure). In such a case, as shown in the Figure, the peripheral edge of the opening 38 in the bottom wall 15 forms a narrow gap 23 with the peripheral surface of the rotor 24, and a surface-treating-gas outlet port 18 may be formed at a position in the bottom wall 15 upstream thereof in the rotation direction of the rotor 24.

FIG. 10 shows an example of a discharge electrode 34 and a ground electrode 36 being fixed on the bottom wall 15 of partitioning member 14 as they hold the surface-treating-gas outlet port 18 in between, while FIG. 11 shows an example in which the discharge electrode 34 faces the peripheral surface of the rotor 24 at a position further upstream of the gap 23 in the rotation direction of the rotor 24 and plasma 40 is formed between the discharge electrode 34 and the grounded rotor 24.

Figure 12:
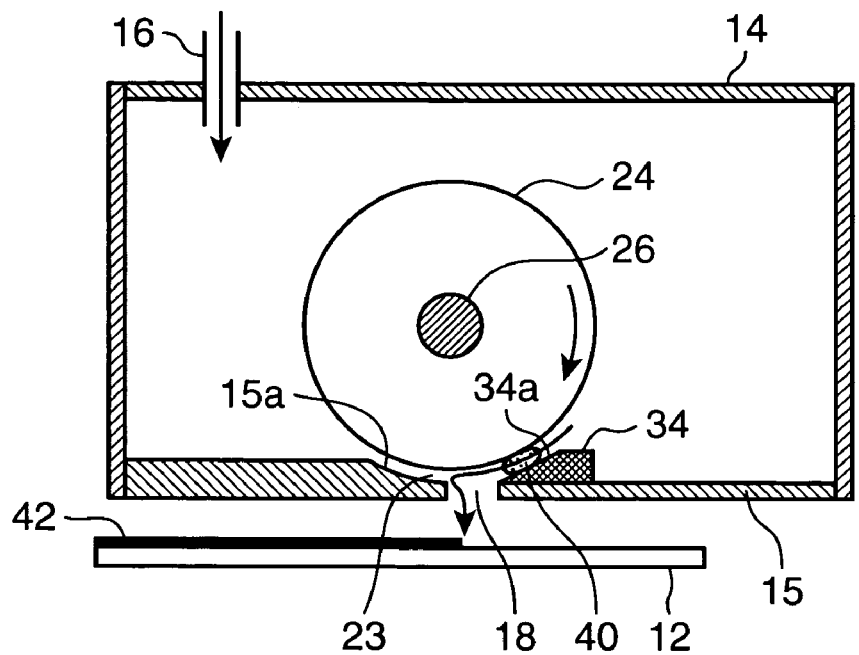
FIG. 12 is a cross-sectional front view illustrating surface-treatment equipment having a concave curving along the rotor peripheral surface formed on the bottom wall of a partitioning member in which discharge and ground electrodes are formed on both sides of the surface-treating-gas outlet port.
Figure 13:
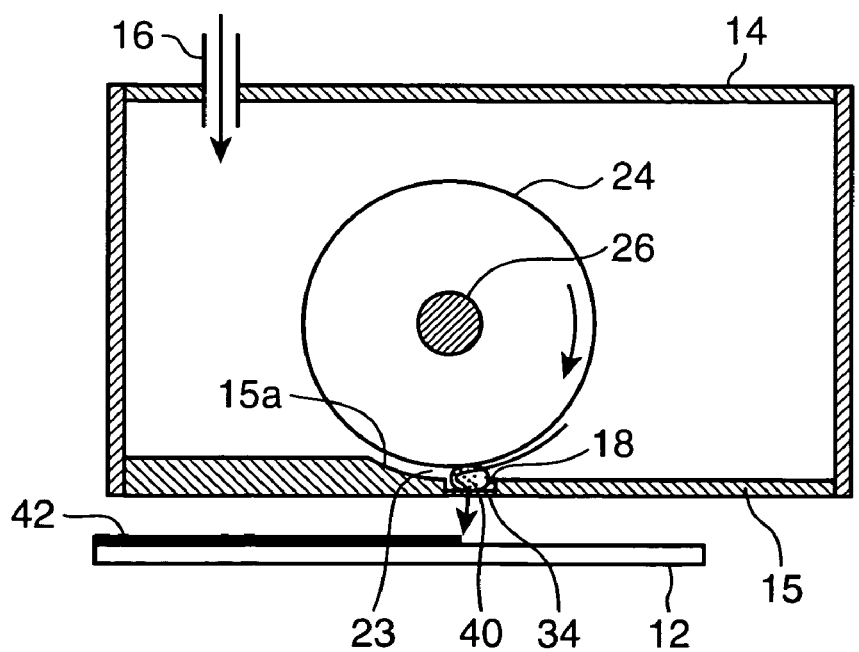
FIG. 13 is a cross-sectional front view illustrating surface-treatment equipment having a concave curving along the rotor peripheral surface formed on the bottom wall of a partitioning member in which a discharge electrode faces the peripheral surface of a grounded rotor.

In the present invention, for supplying back-flow gas from the gap 23 onto the base material 12, the gas-flow resistance at the gap 23 is preferably larger, and a higher gas-flow resistance increases the amount of the back-flow gas. in the equipment shown in FIG. 12 or 13, a concave 15a curving along the peripheral surface of the rotor 24 is formed as an opposing member on the top face of the bottom wall 15 of partitioning member 14 at a position downstream of the surface-treating-gas outlet port 18 in the rotation direction of the rotor 24, and a gap 23 almost uniform in its circumferential direction is formed between the concave 15a and the peripheral surface of the rotor 24.

In such a configuration, it is possible to increase the gas-flow resistance of the gap 23 drastically and the amount of the gas flowing back before the gap 23 effectively. Even in such equipment, there are various embodiments of the plasma-generating means. In the equipment shown in FIG. 12, a discharge electrode 34 is fixed on the bottom wall 15 of partitioning member 14 at a position further upstream of the surface-treating-gas outlet port 18 in the rotation direction of the rotor 24; an inclined face 34a facing the peripheral surface of the rotor 24 is formed on the discharge electrode; and plasma 40 is formed between the inclined face 34a and the rotor 24. In contrast, in the equipment shown in FIG. 13, a gas-permeable mesh discharge electrode 34 is formed as it covers the surface-treating-gas outlet port 18, and plasma 40 is formed between the discharge electrode 34 and the rotor 24 in the surface-treating-gas outlet port 18.

Figure 14:
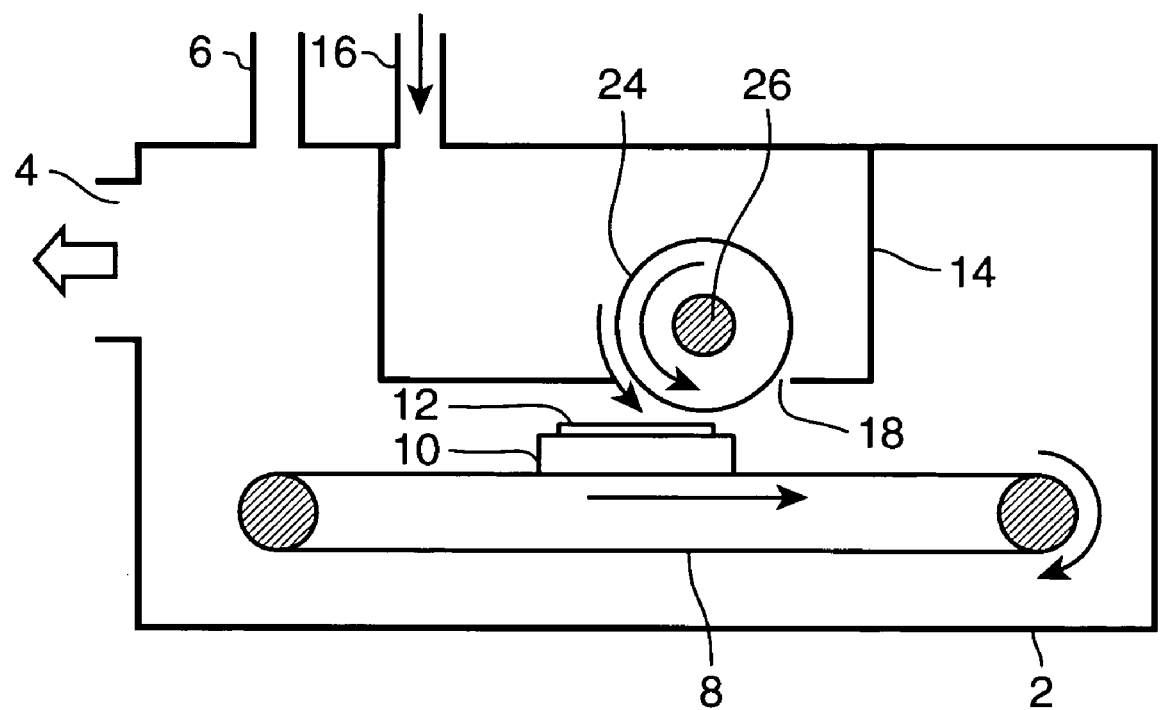
FIG. 14 is a cross-sectional front view illustrating an example of surface-treatment equipment supplying a surface-treating gas by using a rotor facing the surface of a base material.

In the equipment shown in FIG. 12, part of the bottom wall 15 of partitioning member 14 may be used as the discharge electrode as it is. Favorable example of the dimensions of various members in the equipment shown in FIG. 12 will be shown in Example 6 below. In the present invention, it is also possible to supply a favorable surface-treating gas by making the peripheral surface of the rotor 24 face the surface of the base material 12, instead of the opposing plate 20 or the bottom wall 15 of partitioning member 14. Examples thereof are shown in FIGS. 14 and 15. In FIG. 14, the basic configuration of the chamber 2 is the same as that shown in FIG. 1, and description thereof is omitted.

Figure 15A:
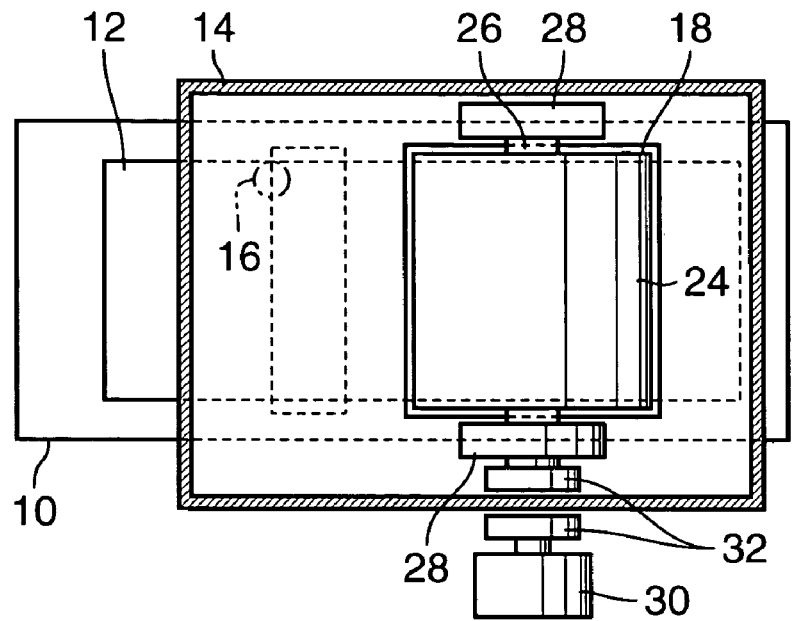
FIG. 15A is a cross-sectional top view illustrating the main region of the equipment shown in FIGS. 14 and 15B, a cross-sectional front view illustrating the same main region.
Figure 15B:
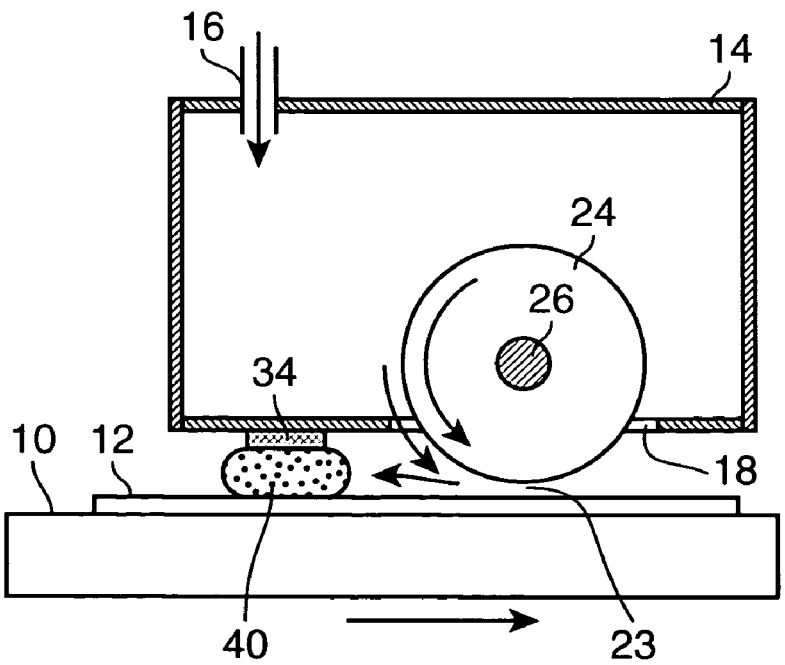

As shown in FIGS. 15A and 15B, the rotor 24 is cylindrical in shape having a cylindrical peripheral surface, similarly to the rotors shown in FIGS. 2A and 2B, but only upper region thereof is enclosed in the partitioning member 14, leaving the lower region sticking out of it. Specifically, a surface-treating-gas outlet port 18 having a shape corresponding to that of the rotor 24 is formed in the bottom wall of the partitioning member 14; the rotor 24 is placed as the lower region of the rotor 24 sticks downward out of the partitioning member 14 through the surface-treating-gas outlet port 18; and the base material 12 and the underside face of the rotor 24 face each other, as they are separated by a narrow gap 23 when the base material 12 is conveyed.

In the equipment too, the axis of rotor 24 is almost perpendicular to the direction of conveying the base material 12; a rotating shaft 26 penetrating the rotor 24 is fixed to the rotor 24 along its axis; and both ends of the rotating shaft 26 are supported ratatably by a pair of bearing stands 28 installed on the bottom wall of the partitioning member 14. A rotating means motor 30 is installed outside the partitioning member 14; magnet couplings 32 cooperatively rotating by magnetic force are connected to the output shaft of the motor 30 and part of the rotating shaft 26; these magnet couplings 32 are placed inside and outside the partitioning member 14 holding it in between; and the rotor 24 is driven to rotate around the axis of the rotating shaft 26 (around the axis almost perpendicular to the base material-conveying direction).

In the equipment, a discharge electrode 34 is formed on the underside bottom wall of the partitioning member 14 (i.e., on the plane of the partitioning member 14 facing the surface of the base material 12). The discharge electrode 34 is formed at a position, with respect to the rotor 24, opposite to the direction of the peripheral speed of the peripheral surface of the rotor 24 (rightward in the Figure) in the gap 23 between the rotor 24 and the base material 12 (left side in the Figure). An electric field for plasma generation is formed between the discharge electrode 34 and the base material 12, by applying a radio/high frequency voltage (or DC voltage) to the discharge electrode 34 and the base material 12 as it is grounded.

In the equipment too, the clearance between the guide plane of the opposing plate 20 and the side wall of the rectifier plate 22 is set greater than the clearance of the gap 23 between the peripheral surface of the rotor 24 and the top face of the opposing plate 20.

Hereinafter, the method of forming an oxide layer on the surface of a base material 12 by using the equipment will be described.

Among the operations in the method, "1) base material-conveying operation" is the same as that above. "2) Source gas supplying operation" is simply to supply a source gas into the chamber 2.

In "3) surface-treating-gas supplying operation", a carrier gas such as argon and a surface-treating gas containing an oxidize such as $O_2$, $N_2O$, $NO_2$, or air are supplied into the partitioning member 14 through the surface-treating-gas inlet port 16 similarly as described above, but in the partitioning member 14 the rotor 24 is rotated by operation of the motor 30 in the arrow direction in FIG. 1 or 2, i.e., in the direction of the peripheral speed component of the peripheral surface of the rotor 24 leaving from the surface of the base material 12 on the base-material conveying plate 10 at the gap 23 between the peripheral surface of the rotor 24 and the surface of the base material 12.

The surface-treating gas is dragged in by the peripheral surface by rotation of the rotor 24, and fed from the partitioning member 14 through the surface-treating-gas outlet port 18 onto the surface of the base material 12 and to the gap 23. However, because the clearance of the gap 23 is small, most of the surface-treating gas flows back toward upstream in the rotation direction of the rotor 24, and is fed into the space between the surface of the base material 12 and the bottom wall of the partitioning member 14.

When an electric field at a particular strength is applied between the surface of the base material 12 and the discharge electrode 34 then, the surface-treating gas supplied into the electric field region generate plasma 40; and the source gas in chamber 2 forms a thin film on the surface of the base material 12 in chemical reaction on the base material 12 by the plasma 40.

The method does not demand strict control of the gap clearance, compared to traditional methods, for example of generating plasma in the narrow gap between a rotary electrode and a base material 12; and, in addition, it is possible supply a surface-treating gas onto the base material 12 uniformly in the width direction (direction perpendicular to the base material-conveying direction) by using the drag-in of the surface-treating gas by rotation of the rotor 24 and back-flow of the surface-treating gas from the gap 23 between the rotor 24 and the base material 12, and thus, to perform high-quality surface treatment.

It is also possible to form a thin film by converting the source gas together with the surface-treating gas fed into the partitioning member 14 into the plasma state and supplying the plasma gas onto the surface of the base material 12; and in such a case, for example, only a carrier gas is supplied from the gas inlet 6 into the chamber 2, similarly to the equipment shown in FIG. 4 or 5.

The present invention is not limited to the plasma CVD described above, and, for example, thermal CVD of making a gas react chemically by the heat energy provided by heating the base material 12 previously at high temperature is also applicable. In such a case, a suitable surface-treating gas is supplied onto surface of the base material 12, similarly as described above.

Figure 16:
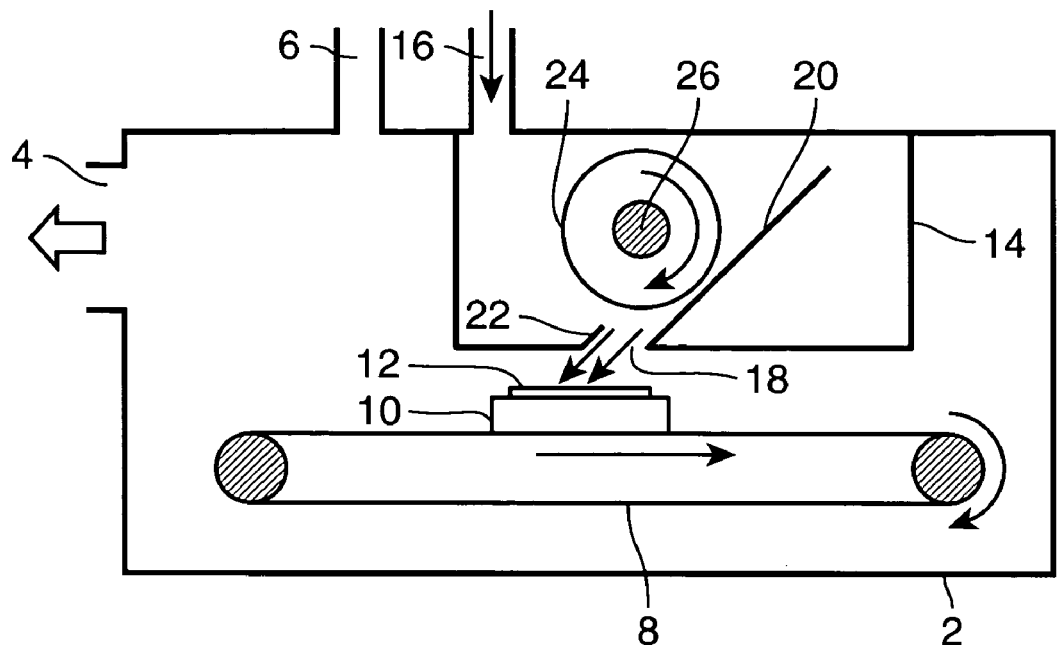
FIG. 16 is a cross-sectional front view illustrating an example of surface treatment by rotating the rotor in the opposite direction in the equipment shown in FIG. 4.

Although the gas flowing back from the gap 23 between the rotor 24 and the opposing plate 20 or base material 12 is supplied onto the surface of the base material 12 in any equipment shown in FIG. 1 to 15, for example as shown in FIG. 16, the rotor 24 in the equipment shown in FIG. 2 may be rotated in the opposite direction, the gas passing out of the gap 23 between the rotor 24 and the opposing plate 20 may be supplied as it is onto the surface of the base material 12 in the peripheral speed direction of the rotor 24.

Figure 17:
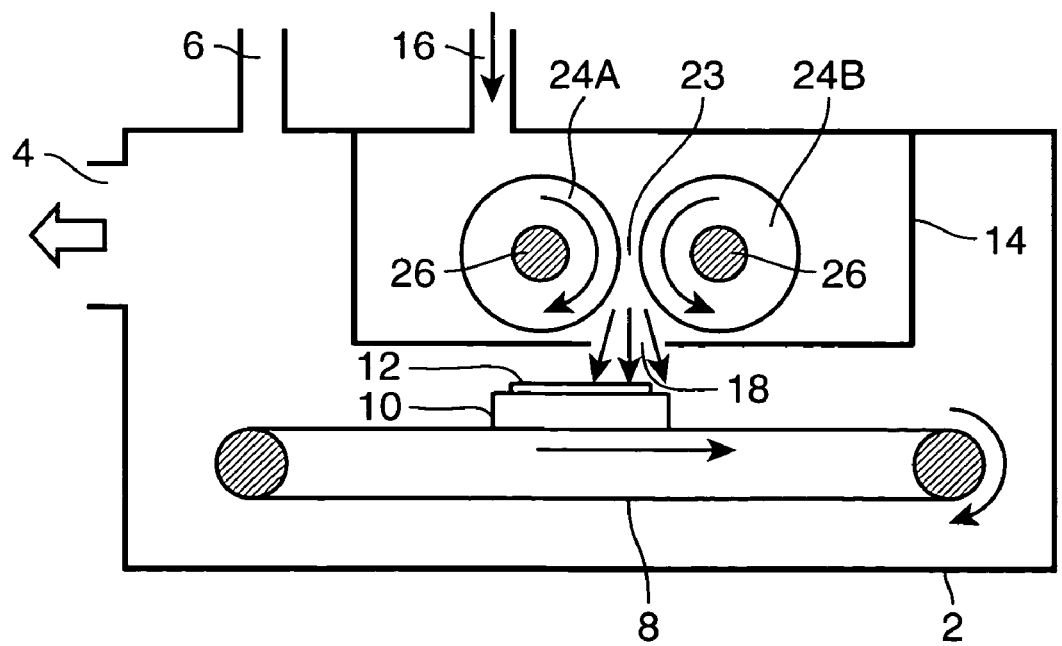
FIG. 17 is a cross-sectional front view illustrating surface-treatment equipment supplying a surface-treating gas by using a pair of rotors facing each other.

Alternatively as shown in FIG. 17, a pair of rotors 24 may be placed in the partitioning member 14 as they are separated from each other by a narrow gap 23, and the gas passing out of the gap 23 may be supplied as it is onto the surface of the base material 12, while the rotors are rotated in opposite directions. In such a case, each of the rotors 24 plays a role as the opposing member.

In the equipment shown in FIG. 14 or 15, the gas passing out of the gap 23 between the rotor 24 and the base material 12 may be supplied onto the surface of the base material 12 by rotating the rotor 24 in the direction opposite to the arrow direction shown in the Figure.

However, as described above, supply of the back-flow gas from the gap 23 gives an advantage of uniform supply of the surface-treating gas onto the surface of the base material 12 in a more stabilized pressure state.

Hereinafter, preferable Example will be described.

EXAMPLE 1

Titania (titanium dioxide film) is formed in the equipment shown in FIG. 4 or 5. A glass plate having a thickness of 4 mm was used as the base material 12 and $Ti(i-OC_3H_7)_4$ as the source gas; a mixed gas of helium and oxygen was fed through the surface-treating-gas inlet port 16 into the partitioning member 14, and a gas prepared by diluting the source gas with helium was introduced through the gas inlet 6 into the chamber 2. Plasma was generated by applying a radio/high frequency voltage at 13.56 MHz to the discharge electrode 34, and the activated helium-oxygen gas was supplied onto the base material 12.

By rotating the rotor 24 at a rotation of 1500 rpm under the condition above, it was possible to supply the gas uniformly at an accuracy of ±1% or less in the width direction (direction perpendicular to the base material-conveying direction) onto the surface of the base material 12. It was also possible to obtain the same effect when the source gas used, $Ti(i-OC_3H_7)_4$, was replaced with $Ti(t-OC_4H_9)_4$. In contrast, it was not possible to form a film by using any of the source gases when the rotor 24 is not rotated.

EXAMPLE 2

Silica (silicon dioxide film) was formed by thermal CVD in the equipment shown in FIG. 16. A glass plate having a thickness of 0.7 mm was used as the base material 12; and it was conveyed as it is heated at 300° C. and further to 600° C. immediately before the surface-treating-gas outlet port 18, and then, exposed to the surface-treating gas sprayed. A mixed gas of a source gas tetraethoxysilane (TEOS) diluted with a carrier gas helium to a concentration of 1.5% was used as the surface-treating gas.

By rotating the rotor 24 at a rotation of 1,500 rpm under the condition above, it was possible to supply the gas uniformly at an accuracy of ±3% or less in the width direction (direction perpendicular to the base material-conveying direction) onto the surface of the base material 12, while it was only possible to obtain a uniformity of approximately ±50% when the rotor 24 was not rotated and the gas was discharged through the surface-treating-gas outlet port 18 into the partitioning member 14 only by the pressure supplying the surface-treating gas.

EXAMPLE 3

In the equipment shown in FIG. 14 or 15, a silicon dioxide film was formed by using tetraethoxysilane (TEOS) as the source gas and helium as the carrier gas, while the clearance of the gap 23 between the rotor 24 and the opposing plate 20 was changed as needed. The distance between the base material and the discharge electrode 34 then was 5 mm, the diameter of the rotor 24 was 100 mm, and the rotational frequency was 1,500 rpm.

Figure 18A:
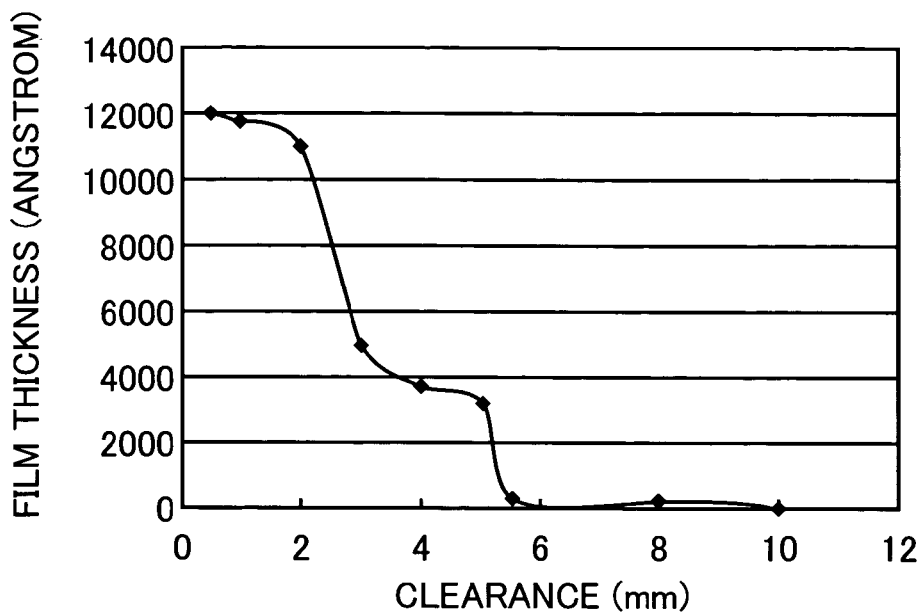
FIG. 18A is a graph showing the relationship between the clearance of the gap between the rotor and the base material and the film-forming velocity in the equipment shown in FIGS. 14, and 18B, a graph showing the relationship between the rotor rotational frequency and the film-thickness distribution in the same equipment.

FIG. 18A shows the relationship between the clearance of the gap 23 and the thickness of the thin film formed during one minute after initiation of film formation. The FIG. confirms that it is possible to improve the film-forming velocity drastically by reducing the clearance of the gap 23 between the peripheral surface of the rotor 24 and the opposing plate 20 to 5 mm or less, and to form a film at an extremely high velocity in particular by reducing the clearance of the gap 23 to 2 mm or less (more preferably 1 mm or less) in this Example.

Figure 18B:
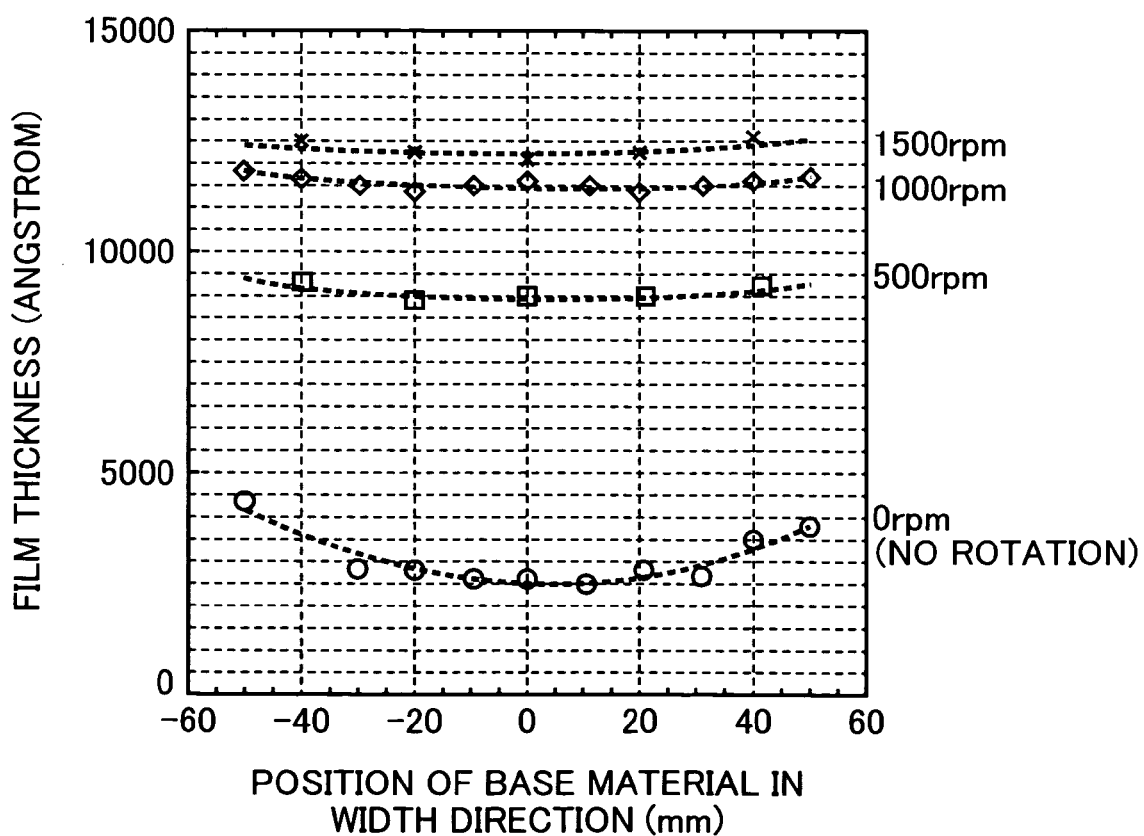

Separately in Example 3, film-forming experiments are done by changing the rotational frequency of the rotor 24 while fixing the clearance of the gap to 1 mm, and the results are shown in FIG. 18B. As shown in the Figure, although it is impossible to raise the film-forming velocity, and also, the film thickness at both end of the base material 12 becomes greater because the gas migrates to the wide space at both ends of the rotor 24 when the rotor 24 is not rotated (0 rpm), the growth rate and the uniformity in film thickness were improved as the rotational frequency of the rotor 24 was raised; and it is possible to raise the accuracy in film thickness to a level where the fluctuation in film thickness in the base-material width direction (direction perpendicular to the base material-conveying direction) is ±1% or less at a high rotational frequency of 1,500 rpm.

EXAMPLE 4

Favorable dimensions of the main members in the equipment shown in FIG. 8 are shown below:

1) Minimum clearance of the gap between the peripheral surface of the rotor 24 and the partitioning member bottom wall 15: 1 mm 2) Distance between the position where the gap is minimum and the surface-treating-gas outlet port 18: 11 mm 3) Gap width of the surface-treating-gas outlet port 18: less than 1 to 5 mm 4) Thickness of the bottom wall 15 (depth of the surface-treating-gas outlet port 18): 5 mm 5) Clearance between the underside of bottom wall 15 and the base material 12: 5 mm 6) Cross-sectional shape of the discharge electrode 34 or the ground electrode 36: rectangular (3 mm in length×5 mm in width)

EXAMPLE 5

Favorable dimensions of the main members in the equipment shown in FIG. 9 are shown below:

1) Minimum clearance of the gap between the peripheral surface of the rotor 24 and the partitioning member bottom wall 15: 1 mm 2) Distance between the position where the gap is minimum and the surface-treating-gas outlet port 18: 11 mm 3) Gap width of the surface-treating-gas outlet port 18: less than 1 to 5 mm 4) Thickness of the bottom wall 15 (depth of the surface-treating-gas outlet port 18): 5 mm 5) Clearance between the underside of bottom wall 15 and the base material 12: 5 mm 6) Inclination angle of the inclined face 34*a* of discharge electrode 34: 30°

7) Minimum difference in level between the inclined face 34*a* of discharge electrode 34 and the peripheral surface of the rotor 24: 2 mm.

EXAMPLE 6

Favorable dimensions of the main members in the equipment shown in FIG. 12 are shown below:

1) Clearance of the gap between the peripheral surface of the rotor 24 and the concave 15*a*: 1 mm 2) Thickness of the bottom wall 15: 6 to 10 mm 3) Clearance between the underside of bottom wall 15 and the base material 12: 5 mm 4) Inclination angle of the inclined face 34 of discharge electrode 34: 30°

7) Minimum difference in level between the inclined face 34*a* of discharge electrode 34 and the peripheral surface of the rotor 24: 1 to 5 mm

INDUSTRIAL APPLICABILITY

As described above, the present invention makes uniform supply of a gas onto a base material possible in equipment simpler and lower in cost, and thus, high-quality surface treatment possible.

What is claimed is:

1. A surface-treatment method, comprising an operation of conveying a base material in a particular direction and a gas-supplying operation of supplying a surface-treating gas onto the surface of the base material, wherein the gas-supplying operation is performed by using a surface-treatment equipment having an opposing member formed at a position separated from the base material and a rotor with a cylindrical peripheral surface facing the opposing member, the opposing member and the cylindrical peripheral surface being separated by a narrow gap from each other, and by rotating the rotor around an axis almost perpendicular to the base material-conveying direction and allowing the surface-treating gas to be dragged by the cylindrical peripheral surface of the rotor into the narrow gap and further fed from the gap onto the base material surface.

2. The surface-treatment method according to claim 1, wherein the gas-supplying operation is performed so as to feed the gas flowing back from the gap toward upstream in the rotor-rotation direction onto the surface of the base material.

3. The surface-treatment method according to claim 1, wherein the surface treatment includes a treatment of forming a thin film on the surface of the base material and the base material surface is treated by adding a source gas being source material for the thin film to the surface-treating gas and subjecting the source gas to a chemical reaction on the base material surface or in a neighborhood thereof where an electric field for plasma generation is formed.

4. The surface-treatment method according to claim 1, wherein an electric field for plasma generation is formed in a region from the rotor to the surface of the base material and the surface-treating gas is supplied to a position where the electric field is formed.

5. The surface-treatment method according to claim 4, wherein the surface treatment includes a treatment of forming a thin film on the surface of the base material and the thin film is formed on the surface of the base material by the plasma generated by supplying the surface-treating gas into the electric field or by supplying radical species excited by the plasma onto the surface of the base material, supplying the source gas being source material for the thin film to the plasma or radical species on the base material surface and subjecting the source gas to a chemical reaction on the base material surface or in a neighborhood thereof where the electric field is formed.

6. The surface-treatment method according to claim 5, wherein the surface-treating gas contains at least one of an inert gas and an oxygen-containing gas.

7. A surface-treatment equipment, comprising a base material-conveying means of conveying a base material in a particular direction and a gas-supplying means of supplying a surface-treating gas onto the surface of the base material, wherein: the gas-supplying means comprises a rotor having a cylindrical peripheral surface with an axis almost perpendicular to the base material-conveying direction, a rotating means of rotating the rotor around the axis and an opposing member formed at a position facing the cylindrical peripheral surface of the rotor as separated by a gap; and the opposing member is so placed that the surface-treating gas dragged in by the cylindrical peripheral surface with the rotation of the rotor is driven to the gap between the cylindrical peripheral surface of the rotor and the opposing member and fed from the gap onto the base material surface.

8. The surface-treatment equipment according to claim 7, wherein: an electric field-forming means of forming an electric field for plasma generation is installed in a region from the rotor to the surface of the base material; and a surface-treatment plasma is generated by flow of the surface-treating gas in the electric field.

9. The surface-treatment equipment according to claim 7, further comprising a partitioning member covering the rotor and the opposing member, wherein the partitioning member has a surface-treating-gas inlet port for introducing a surface-treating gas into the partitioning member and a surface-treating-gas outlet port for discharging the surface-treating gas from the gap between the rotor and the opposing member in the partitioning member to the surface of the base material.

10. The surface-treatment equipment according to claim 7, wherein the gas-supplying means has the rotor and the opposing member so placed that the gas flowing back from the gap toward upstream in the rotor-rotation direction is fed onto the surface of the base material.

11. The surface-treatment equipment according to claim 10, wherein the opposing member is placed between the surface of the base material and the rotor as it also faces the surface of the base material and has a gas outlet port located at the opposing member at a position upstream of the position where the clearance between the opposing member and the rotor is minimal in the rotor-rotation direction, so that the gas flowing back from the gap toward upstream in the rotor-rotation direction is fed through the gas outlet port onto the base material surface.

12. The surface-treatment equipment according to claim 11, wherein the gas outlet port is gap in shape and extends in the direction in parallel with the rotation-axis direction of the rotor.

13. The surface-treatment equipment according to claim 11, wherein the opposing member has a concave curving along the cylindrical peripheral surface of the rotor and is placed at a position where an almost uniform narrow gap is formed between the concave and the cylindrical peripheral surface of the rotor in the circumferential direction.

14. The surface-treatment equipment according to claim 11, further comprising a partitioning member covering the rotor, wherein the partitioning member has a surface-treating-gas inlet port for introducing a surface-treating gas into the partitioning member and part of the wall constituting the partitioning member represents the opposing member present between the rotor and the base material.

15. The surface-treatment equipment according to claim 7, wherein the opposing member has a guide plane guiding the surface-treating gas from the gap to the surface of the base material.

16. The surface-treatment equipment according to claim 15, wherein the guide plane of the opposing member faces the cylindrical peripheral surface of the rotor.

17. The surface-treatment equipment according to claim 15, wherein a rectification member is placed at a position facing the guide plane so that the surface-treating gas flows between the rectification member and the guide plane.

18. The surface-treatment equipment according to claim 17, wherein opposed plasma-generating electrodes are placed on the guide plane and the opposed face of the rectification member so that the surface-treating gas is subjected to a chemical reaction by allowing the surface-treating gas to pass between the electrodes in the state where an voltage is applied between these electrodes.

19. The surface-treatment equipment according to claim 17, wherein the clearance between the guide plane of the opposing member and the rectification member is greater than the clearance between the cylindrical peripheral surface of the rotor and the guide plane.

20. The surface-treatment equipment according to claim 15, wherein the opposing member is planer in shape, an end face thereof facing the cylindrical peripheral surface of the rotor, and a side wall of the opposing member represents the guide plane.

21. The surface-treatment equipment according to claim 20, wherein the end face of the opposing member has a surface in the shape compatible with the cylindrical peripheral surface of the rotor.

22. The surface-treatment equipment according to claim 20, further comprising, in addition to the opposing member, a downstream opposing member facing the cylindrical peripheral surface of the rotor as separated by a gap at a position downstream of the opposing member in the rotor-rotation direction, and at least one gas-supplying unit for supplying a gas other than the surface-treating gas into the region between the downstream opposing member and the opposing member, wherein the downstream opposing member is so placed that the gas supplied from the gas-supplying unit is dragged in by the cylindrical peripheral surface of the rotor and guided from the gap between the rotor and the downstream opposing member along the downstream opposing member to the base material surface.

23. The surface-treatment equipment according to claim 22, wherein an electric field-forming means of forming an electric field for plasma generation is placed in a region from the gap between the rotor and the opposing member to the base material surface so that a surface-treatment plasma is generated by the flow of the surface-treating gas in the electric field and a source gas for forming a thin film on the base material surface through a chemical reaction by the surface-treatment plasma is supplied from the gas-supplying unit.

24. The surface-treatment equipment according to claim 22, wherein the distance between the rotor and the opposing member is smaller than the distance between the rotor and the downstream opposing member.

25. A surface-treatment equipment for treating the surface of a base material by subjecting a surface-treating gas to a chemical reaction on the base material surface or in a neighborhood thereof where an electric field for plasma generation is formed, comprising a base material-conveying means of conveying a base material in a particular direction and a gas-supplying means of supplying a surface-treating gas into the surface of the base material, wherein: the gas-supplying means comprises a rotor having a cylindrical peripheral surface with an axis almost perpendicular to the base material-conveying direction, the cylindrical peripheral surface facing the surface of the base material conveyed by the base material-conveying means, a rotating means of rotating the rotor around the axis, a partitioning member covering the rotor except the region of the rotor facing the surface of the base material and an electric field-forming means of forming an electric field between the face of the partitioning member facing the surface of the base material and the surface of the base material; the surface-treating gas supplied into the partitioning member is driven into the gap between the cylindrical peripheral surface of the rotor and the surface of the base material by rotation of the rotor as it is dragged in by the cylindrical peripheral surface; and the rotor and the partitioning member are so placed that plasma is generated as the surface-treating gas is supplied from the gap into a region where an electric field is formed by the electric field-forming means.

26. The surface-treatment equipment according to claim 25, wherein the gas-supplying means has the rotor and the partitioning member so placed that the gas flowing back from the gap between the rotor and the surface of the base material toward upstream in the rotor-rotation direction is fed into the electric field-forming region.

27. The surface-treatment equipment according to claim 25, wherein the clearance between the surface of the base material and its opposing face of the partitioning member in the electric field-forming region is greater than the clearance between the surface of the base material and the cylindrical peripheral surface of the rotor.

* * * * *